US007062337B1

(12) United States Patent
Blesser

(10) Patent No.: US 7,062,337 B1

(45) Date of Patent: Jun. 13, 2006

(54) ARTIFICIAL AMBIANCE PROCESSING SYSTEM

(76) Inventor: Barry A. Blesser, 280 Common St., Belmont, MA (US) 02478

( * ) Notice: Subject to any disclaimer, the term of this patent is extended or adjusted under 35 U.S.C. 154(b) by 947 days.

(21) Appl. No.: 09/922,816

(22) Filed: Aug. 6, 2001

Related U.S. Application Data

(60) Provisional application No. 60/226,844, filed on Aug. 22, 2000.

(51) Int. Cl.
*G06F 17/00* (2006.01)
*H03G 3/00* (2006.01)
*G10H 1/02* (2006.01)
*G10H 5/00* (2006.01)

(52) U.S. Cl. ............................ 700/94; 381/63; 84/630; 84/661

(58) Field of Classification Search .................. 700/94; 381/63, 98, 71.11; 64/630, 707; 369/60.01; 333/186; 327/552, 556, 557
See application file for complete search history.

(56) References Cited

U.S. PATENT DOCUMENTS 3,110,771 A 11/1963 Logan, Jr. et al.
4,181,820 A 1/1980 Blesser et al.
4,268,717 A 5/1981 Moore
4,731,848 A 3/1988 Kendall et al.
4,955,057 A 9/1990 Tominari
5,247,474 A * 9/1993 Kowaki ...................... 708/819
5,491,754 A 2/1996 Jot et al.
5,555,306 A 9/1996 Gerzon
5,614,686 A 3/1997 Van Duyne et al.
5,621,801 A 4/1997 Kunimoto et al.
5,633,993 A 5/1997 Redmann et al.
5,729,613 A 3/1998 Poletti
5,812,674 A 9/1998 Jot et al.
5,857,026 A 1/1999 Scheiber
5,896,291 A * 4/1999 Hewitt et al. ................. 700/94
5,943,427 A 8/1999 Massie et al.
5,946,400 A 8/1999 Matsuo
6,078,669 A 6/2000 Maher
6,188,769 B1 2/2001 Jot et al.
6,665,409 B1 * 12/2003 Rao ............................ 381/63

* cited by examiner

*Primary Examiner*—Huyen Le
*Assistant Examiner*—Andrew C. Flanders
(74) *Attorney, Agent, or Firm*—Kudirka & Jobse, LLP

(57) ABSTRACT

An apparatus and method simulates more accurately the natural statistics of a physical reverberation process. A new filter design is provided having a comb shaped group delay. Gain minimums at a plurality of frequencies are combined with a delay line to create a constant reverberation time independent of frequency while allowing for temporal spreading. In addition, the connection topology between the plurality of energy transmission networks is temporally randomized to facilitate energy distribution within the reverberation apparatus. Both the temporal and spectral responses are actively changed on each iteration of the energy recirculation. By making the response have a high echo density and a lack of spectral coloration in the decay, the illusion of a natural process is enhanced.

19 Claims, 14 Drawing Sheets

ARTIFICIAL AMBIANCE PROCESSING SYSTEM

RELATED APPLICATION

This application claims priority to U.S. provisional application No. 60/226,844, entitled "Artificial Ambiance Processing System, by Barry A. Blesser, filed Aug. 22, 2000.

FIELD OF THE INVENTION

The invention relates to artificial reverberation and ambiance systems that create the illusion of real acoustic spaces, and more specifically to systems for simulating more accurately the natural statistics of a physical reverberation process.

BACKGROUND OF THE INVENTION

In an acoustic space, the sound travels from the source to the listener via many different paths. The direct path, referred to as the "dry" signal, corresponds to the signal of an anechoic space, an outdoor performance, or a close microphone. The indirect path, referred to as the "wet" signal, bounces off the walls or other surfaces multiple times and appears at the listener delayed, attenuated, and spectrally modified. The process continues with more and more reflections arriving at the listener later and later. Thus, all reverberation processes can be thought of as a rapidly increasing series of reflections or echoes. In audio signal processing, "ambiance" is the general sense of creating an illusion of a space. "Reverberation" is more specifically the decay process once the process has become so complex that only a statistical representation is useful. Ambiance includes reverberation and spatial location of the listener. Since the earliest days of radio broadcasting and recorded music, the need for artificial reverberation and spatial ambiance has been well known. When a microphone is placed close to a performer to avoid picking up background noise, very little of the environmental reflections appear in the signal. Reverberation, created by an artificial system, is added to the microphone signal to recreate the perception of the acoustic space.

Typically, signal processing systems often fail to accurately duplicate natural acoustics for both practical and theoretical reasons. The echo pattern or impulse response is extremely complex and only the early part of the process can be characterized in detail. Impulse response measurement decays into the noise level because the amount of source energy is limited to a fraction of the atmospheric pressure. Averaging cannot be used because of the lack of thermal equilibrium, which causes minor changes in the speed of sound. For the same reason, frequency response measurements never reach a stable steady state. Also, the computational burden on ray tracing algorithms grows exponentially. Moreover, the detailed echo pattern is different for each seat in every space and the physics of a 3-dimensional space is fundamentally different from the 1-dimension properties of signal processing. Along a given axis, the speed of sound varies as a function of the angular orientation, giving a sound wave two extra degrees of freedom. In a signal processing system, signals travel at a fixed rate through all delay lines. Fortunately, the physical complexity of the process does not match the human's ability to perceive minor differences. As a result, there is a large body of research that teaches which attributes are perceptible.

Because of these factors, artificial systems attempt to create the perceptual illusion of a real acoustic space without trying to be physical simulations thereof. Large spaces have been better analyzed in terms of statistics rather than in terms of an explicit impulse response. When an artificial system has similar statistics the illusion is good; when those statistics differ, the illusion is weak. However, the prior art shows a tendency to either use an artistic or purely mathematical approach. There is very little prior work that provides a formalism that can relate the statistical properties of an artificial system to the perceptually relevant properties of acoustic performance spaces.

The current generation of artificial reverberation systems is based on a few digital signal processing primitives including delay lines, multipliers, and adders. From these primitives, more complex elements are created. A comb filter, that is implemented with a delay line having feedback of less than 1, derives its name from the fact that the frequency response is comb shaped. An allpass filter, which is a comb filter combined with a feedforward path, has a flat frequency response, hence the name allpass. An energy transmission network, which is composed of a large delay line, holds and transmits the energy between different parts of the system. These transmission networks are directly analogous to a linear path through cubic sections of air in a real acoustic space, which also hold and transmit acoustic energy. Other elements, such as filters, are added to provide the more subtle attributes such as high frequency absorption of wall surfaces and the air itself.

Historically, reverberation systems were based on one of two basic topologies. One of these topologies uses a multiplicity of comb filters fed in parallel from a series of allpass filters. The other topology uses a single large loop composed of a multiplicity of delays, lowpass filters, and allpass filters. About 15 years ago, these structures were represented as static mixers using a matrix notation. Not only can the matrix notation represent all of the basic reverberation topologies by selecting appropriate numbers, but the notation can also be used to create other topologies as long as the numbers are constrained to a set of mathematical rules. The matrix column vectors should have unity magnitude and each of these vectors should be orthogonal to all the others. Any set of numbers that satisfies these rules is the to be a unitary orthogonal matrix. However, there are an infinity of matrix numbers that satisfies the mathematical rules. The prior art does not teach a selection criterion. Constraining the mixer coefficients to be consistent with these rules is necessary, but not sufficient, to create a high quality reverberation system because the rules ignore additional perceptual issues that are unrelated to the mathematical formalisms. The various necessary perceptual optimizations often conflict with one another; optimizing one, while de-optimizing the other.

Another problem of the prior art is that it is limited to using a relatively small number of energy transmission networks because of their high economic burden. It is essentially impossible to fill these networks uniformly because statistical averaging requires a large number of such elements. In a real acoustic space, the energy density becomes uniform after the reverberation process has continued for a modest amount of time. Artificial systems show a much weaker tendency to produce a uniform energy distribution and, hence, often produce energy periodicity in the reverberation, which is perceptible to the listener.

Because there are different classes of defects in reverberators, it is useful to first consider two extreme classes of sound: broadband pulses and narrow band continuous signals. The former is typical of a pluck on a guitar or a bang of wood blocks, while the latter is typical of a flute, organ and other instruments that have a long steady state. Most music falls between these two cases. In discussing reverberations systems, professional audio engineers will often refer to the system behavior when excited either by an impulse or by a steady state sinewave, representing the two extreme cases. A defective reverberation system will show undesirable properties with one or both of these cases. Typically, an audio engineer first looks for the perceptual smoothness of the reverberation tail as the dominant quality criterion. Secondly, he also looks for spectral coloration in the tail. Does the spectrum of the reverberation have the same spectral content as the original? The untrained listener does not detect these defects explicitly but has the sense that the reverberation is not quite right. Professional sound engineers are, however, very sensitive to even the most minor defects. Experts in the field can catalog dozens of critical cases that form the tool chest for evaluation. The fundamental difficulty in creating the illusion of reverberation derives from the fact that optimizing one set of properties often de-optimizes others.

The prior art has a strong proclivity to describe artificial reverberation systems as being a complex linear and time-invariant filter. The linearity property dictates that scaling the input by a factor will typically scale the output by the same factor. The time-invariant property dictates that shifting the input in time will typically shift the output by the same amount. A similar approach has been rejected when applied to a large acoustic space, such as a concert hall, because it is very misleading and unproductive. It is useful only in the degenerate example of a small and rectangular shaped acoustic space. A concert hall might easily have more than 100,000 resonances and 100,000 discrete echoes. Scientists therefore often use a statistical notation that talks about the frequency response in terms of its average, standard deviation, slope rates, etc. The reverberation decay is described in terms of the spectrum of the amplitude envelope and spectrum of the phase changes. An impulse response can be described in terms of the spectrum of energy variation within a 1 msec. time window. The scientific literature shows that there have been some notable successes in mapping the statistical metrics to the perceptual properties.

In contrast, artificial systems are generally very limited in their complexity. Audio engineers have traditionally not described the reverberation response in terms of statistics but have stayed with the deterministic notion of a linear, time-invariant construct. Some reverberation designers abandon all structured methods and resort to a purely artistic creation process. Because artificial systems are generally built out of less than 20 network modules with only some 50 free parameters, there is no obvious method to incorporate a statistical approach into the design process. There are simply not enough degrees of freedom. Consider, for example, how the resonance density behaves when excited with a narrow band musical note. A large concert hall can easily have a density of well over 10 resonance per Hz, whereas an artificial system might have only 0.3 resonances per Hz. When the density is extremely high, many excited resonances contribute to the response resulting in a random envelope and phase response. With only 2 excited resonances, the envelope will have a characteristic beat tone at a frequency equal to the difference between the two resonances, which sounds very unnatural. This problem has been intuitively understood but has not been extensively studied. Historically, the solution has involved some kind of isolated parameter randomization. For example, a delay can be slowly changed, or a delay output can be panned between random values. All of these methods have limited utility and some negative artifacts. Very few methods work within the main recirculation processing because any artifact, such as needle generation, will also recirculate. The prior art has not solved these problems. The prior art generally ignores the subject of statistical randomization, even though it is critically important.

SUMMARY

This invention improves artificial reverberation and ambiance processing systems by providing a mechanism to create the appropriate random envelope and phase statistics in the output signal. The inventive system uses two new building blocks: (1) a notchpass filter as a constituent part of an energy dispersive transmission network and (2) an energy preserving modulation mixer in a recirculation topology, both of which can be used separately, but which reinforce each other when used together. In a typical embodiment, the modulation mixer creates feedback by randomly routing the output energy from a plurality of transmission networks back to their respective inputs. As the energy recirculates, both the networks and the mixer repeatedly change the audio in a statistically desirable way thereby avoiding the more typical structured periodicity and beat tones typical of prior art systems.

The notchpass filter may comprise a delay line with both feedback and feedforward appropriately adjusted to have gain minimums at the same plurality of frequencies as the group delay maximums. The notchpass filter is then combined with a second, longer delay line and an attenuator to form an energy dispersive transmission network. This network has the dual desirable properties of both increasing the echo density for pulse signals and differentially delaying the spectral components for steady A state signals. By appropriate selection of the network parameters, the reverberation time can be made independent of frequency even though the filter's gain, by itself, is not spectrally constant. Having a constant reverberation time may be critical because any spectral component with a longer decay time would remain audible while all other components had decayed. It is desirable for the spectral balance of the reverberation decay to remain constant and to be the same as the input audio to avoid coloration, a situation where a few tones completely dominate. Because most reverberation topologies are based on recirculation, the energy dispersive transmission network will operate repeatedly on the previous signals as they circulate around the feedback loop. On each iteration, the echo density will be dramatically increased and the spectral components will be further spread in time. Perceptually, the constantly changing recirculated signals take on a random quality without any periodicity.

An energy preserving modulation mixer may also be used to create n audio output signals, called an audio output vector, from n audio input signals, called the audio input vector, using a transformation by which each output signal is composed of a changing weighted sum of the input signals. The transformation mapping between the audio input vector and the audio output vector may be continuously changed such that the amount of a given audio input signal that appears in a given audio output signal is not static. The transformation, driven by a set of m randomizer signals, is constrained so that the energy in the audio output vector is typically the same as the energy the audio input vector. The modulation mixer's n audio outputs feeds a set of n energy dispersive transmission networks and their respective n outputs feed the mixer's n audio inputs, thus creating an energy recirculation loop. Because the transformation may be continuously changing, the energy from a given network is distributed differently to each of the other networks on each iteration. The modulation mixer does not increase or decrease the energy in the audio vectors; hence the reverberation time is not influenced by the time varying transformation. The m randomizer signals serve to randomize the interconnections between the plurality of energy dispersive transmission networks rather just randomizing a single parameter. The reverberation response can be made to have natural statistics by the appropriate choice of the m randomizer signals. With a static mixer, the reverberation would have a characteristic beat envelope equal to the difference between neighboring resonances. Such undesirable property is avoided by randomization of the topology, or equivalently by randomizing the resonances, but without changing the energy decay process. Randomly moving resonances emulate the high resonance densities of large acoustic spaces.

Since the invention is based on randomization, the total system energy is the only attribute that remains relevant as the individual signal's phase and amplitude are continuously modified during recirculation. Achieving a linear decay process at the output is equivalent to having the total system energy decay at a logarithmic rate. The energy preserving modulation mixer does not change the total energy in the system but does change the distribution among the plurality of networks. Each energy transmission network reduces the energy at a constant rate but does change its signal's phase and amplitude. Both mechanisms have a random quality to create natural statistics at the final output.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views. In the drawing:

FIG. 20 is a block diagram illustrating a reverberation system using the dispersive energy transmission networks and the randomizing modulation mixer;

FIG. 21 is a block diagram illustrating a reverberation system using the dispersive energy transmission networks and the randomizing modulation mixer.

DETAILED DESCRIPTION

Figure 1:
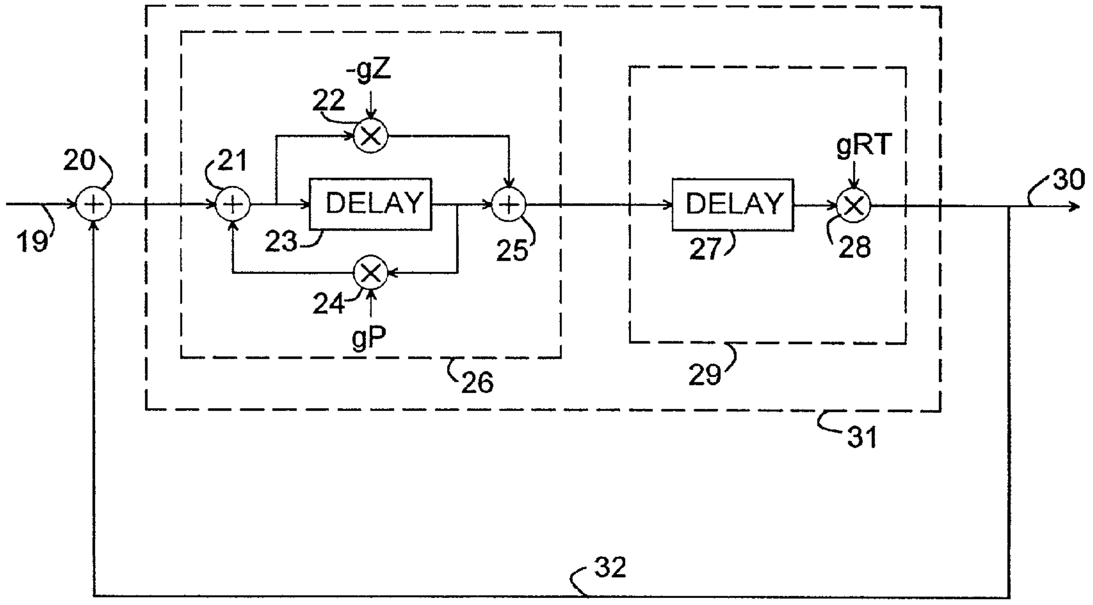
FIG. 1 is a block diagram illustrating an implementation of a reverberation system using a notchpass filter and an energy transmission network.

This invention provides a system capable of actively creating the required random temporal and spectral statistics of natural reverberation for audio signals, especially speech and music. An impulse and a sinewave are generally used to illustrate the behavior of the invention because they span the complete range of interesting audio cases. The former exists only in short instant of time but has a very broad spectrum; the latter exists for a long time but has a very narrow spectrum. The invention allows for the simultaneous optimization of both the impulse and sinewave response. The prior art puts these two optimizations in conflict. An unstructured high echo density no longer produces spectral coloration and vice versa. These conclusions may apply to a vast number of reverberation topologies and architectures.

Most reverberation systems contain a multiplicity of long delay lines with attenuation, called energy transmission networks. They hold and transmit the acoustic energy. Except for the case of a very long series chain of energy transmission networks, the networks are configured to recirculate energy via one or more feedback paths. In order to achieve a uniform system reverberation time, all energy transmission networks should have the same ratio of attenuation, when expressed in dB, to its matching delay time. System reverberation time, abbreviated RT, is defined as the time to decay 60 dB. A 100 msec. delay line having an attenuation of 3 dB has the same decay rate as a 200 msec. line with 6 dB of attenuation. Both decay at a rate corresponding to a 2 second RT. Since both the delay length and the attenuation are constant, independent of frequency, the resulting ratio is also constant. Thus, all frequencies typically have the same RT.

This invention modifies the standard energy transmission networks to also produce dispersion. Frequency components are each delayed by a different amounts (spectral spreading) and a single impulse is transformed into a plurality of impulses (temporal spreading). Because these energy transmission networks are embedded in a feedback topology, the temporal and spectral dispersion will modify the signal on each iteration. The continuous change achieves the requirement of preventing coherent patterns in the decay process. Typically, a comb filter added to a delay line will create dispersion. However, the comb filter's frequency response has a grossly non-uniform amplitude and group delay shape. An allpass filter could be used instead to create a flat frequency response, but its group delay would still have a comb filter shape. These structures cannot be used, because they will result in an unacceptable comb shaped RT as a function of frequency. These structures produce a high level of spectral coloration. Only a few frequencies dominate with their much longer RT.

To achieve the requirement of a spectrally flat RT while adding dispersion, this invention creates a new structure, called a notchpass filter. It is built from a comb filter with feedforward, but has the added property that its frequency response is the mirror image of its group delay response. The gain is made to have periodic minimums at the same frequencies as the group delay maximums. Because both the gain minimums and delay maximums can be controlled independently, the energy transmission network's RT can be made to be independent of frequency. The notchpass filter in combination with a standard energy transmission network becomes a new building block, an energy dispersive transmission network, that may replace standard energy transmission networks in reverberation topologies.

Figure 5:
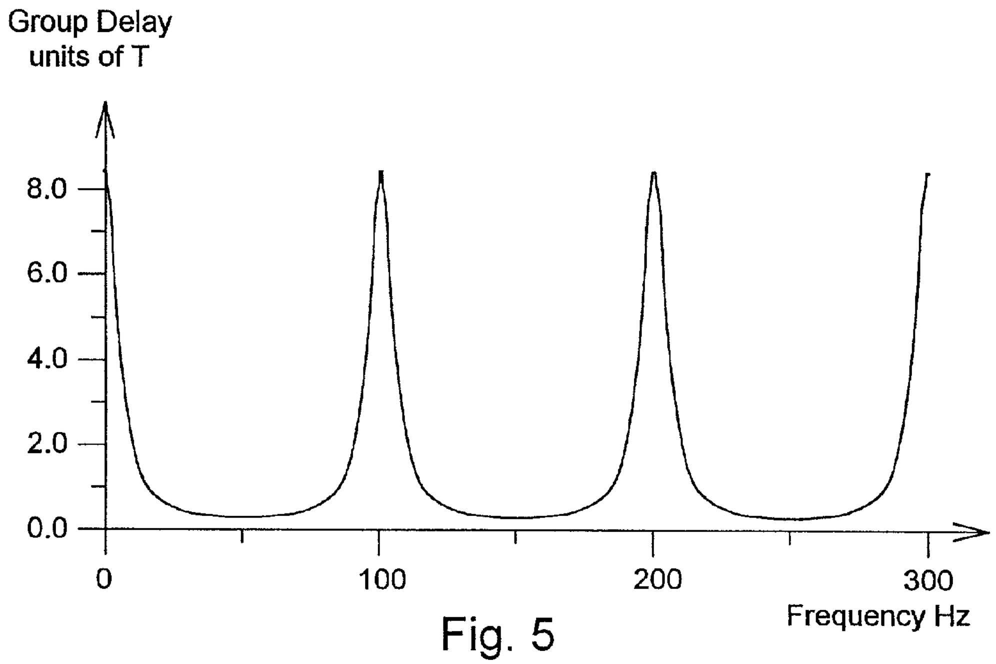
FIGS. 5–6 are graphs illustrating the group delay and amplitude, respectively, as a function of frequency, for the inventive notchpass filter used in a reverberation topology system.
Figure 6:
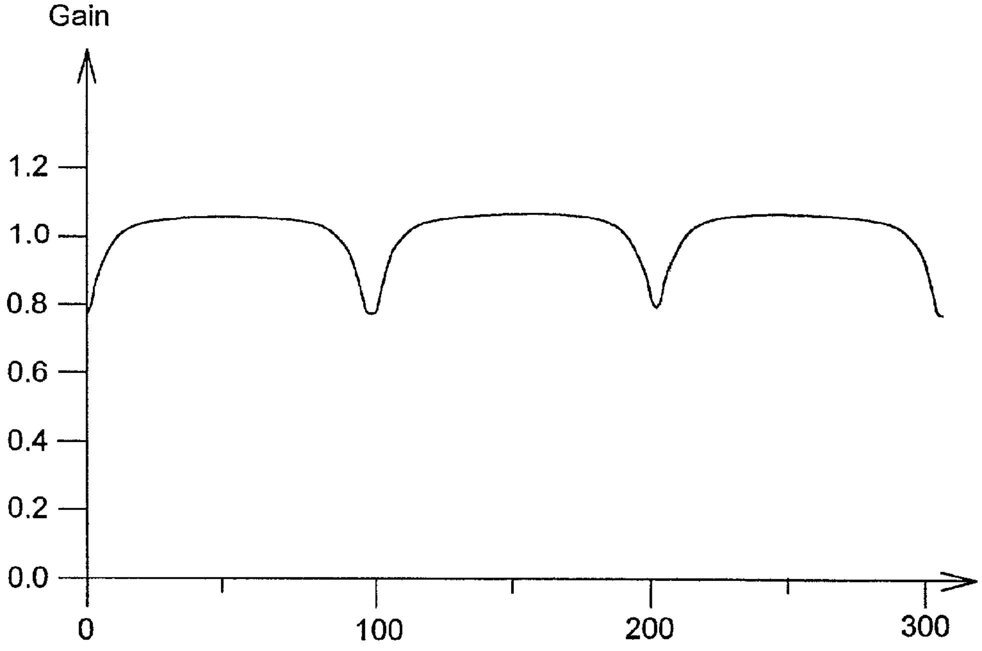

For example, a notchpass filter may have a 10 msec. delay line that produces group delay peaks at 100, 200, 300, 400, etc. Hz, and group delay minimums at 50, 150, 250, 350, etc. Hz. A typical notchpass filter group delay is shown in FIG. 5. Assume that the delay of a standard energy transmission network has a value of 97 msec. and assume that the notchpass filter has a group delay of 53 msec. and 3 msec. at the maximums and minimums, respectively. To make all frequencies have the same 2 second RT, parameters are selected so that the base attenuation is 3 dB and the notchpass filter gain minimums produce an additional 1.5 dB. A typical notch pass gain is shown in FIG. 6. A 100 Hz spectral component experiences a composite delay of 150 msec. with a composite attenuation of 4.5 dB, while the 50 Hz component experiences a shorter 100 msec. delay but with a smaller 3 dB of attenuation. Both spectral components have the same decay rate. However, assuming that the signal has a flat frequency response in each network would be wrong. Rather, the RT may be made to have no frequency dependence. It is necessary only to have a flat spectrum in the reverberation output. Internal signals are irrelevant. All spectral components in the output should decay at the same rate. Historically, prior art systems achieved the flat spectrum by making both attenuation and gain independent of frequency. However, this prevents the desirable property of dispersion from being included within the recirculation. This invention makes them proportional.

When the energy dispersive transmission networks are used in a reverberation system, each spectral component experiences a different reverberation process because the group delays are different for each musical overtone. Each overtone, being at a different frequency, has its own a unique recirculation pattern. On repeated iterations, each overtone is time shifted relative to the others by the difference in group delays at the overtone frequencies. The phase coherence in the decay is completely removed. Impulse signals have the same property. One each iteration, the signal is dispersed anew by the notchpass filter. Furthermore, the echo density at the output increases dramatically as would happen in a natural process because there are k impulse in the notchpass filter output for each input impulse. On the next iteration, each of those k impulse itself produces k more impulses, etc. Even though there is no active randomization, the invention allows each part of the reverberation to be very different from every other part in both its time and spectral structure. RT is defined as the time for the signal to decay by approximately 60 dB. Thus, it is often determined by extrapolating the decay rate, which is the change in signal per unit time with units of dB per second.

The previous discussion illustrated the invention under the assumption that having a spectrally flat decay rate was ideal. In practice, it is more desirable to have a longer RT at low frequencies than at high frequencies. A modest change in RT duplicates real acoustics because the higher frequencies experience more absorption from air attenuation and surface reflections. The desired RT frequency response generally has a downward slope with, for example, values of 3 seconds at 100 Hz, and 1.5 seconds at 5 kHz being typical. In a standard energy transmission network, a simple filter was added to make the main attenuation have the same kind of gradual increase as a function of frequency. The invention may include a matching compensation filter within the notchpass filter so that the depth of its gain minimums also increase with frequency. System RT now has the desired shape, a gradual decrease with increasing frequency, but without any of the comb shape had the notchpass filter not been modified with a matching compensation filter.

There is a direct analogy between an energy transmission network in an artificial system and a volume of air in a natural acoustic space since they both hold and transmit acoustic energy. Because sound travels in 3-dimensions, the energy in a given volume of air can chaotically move to any of its 6 neighboring regions: above, below, left, right, front, and back. Conceptually, the physical space can be thought of as having thousands of individual cubic energy storage volumes. As the natural reverberation process continues, the energy gets uniformly distributed to all of them.

Many prior art systems have achieved the equivalent complex connection between a large number of energy transmission networks by using a 2 or 3 dimensional mesh topology. Such systems remain laboratory curiosities because of their extremely L high compute cost. Economic limitations generally require that only a few energy transmission networks be used. It is also well known that good quality reverberation 1; may require a resonance density of at least 3 per Hz, implying a total delay in all energy transmission networks of 3 seconds. By having four delay networks of 750 msec. each to incorporate 3 seconds of delay, it would take a very long time for the reverberation process to distribute energy uniformly to such large delay lines.

This invention achieves the equivalent statistics using only a modest number of energy transmission networks with only a modest amount of total delay. The smaller delays allows for rapid filling while the small number of networks satisfies the economic requirements. This invention provides a methodology for time randomization of the topological connections between energy transmission networks. Its is well known that a static mixer based on the unitary orthogonal matrix properties can provide a energy distribution but the statistics only work when there are a large number of energy transmission networks. The invention solves these problems by randomly changing the topological connections represented by the modulation mixer. Without such randomization, and with a limited amount of total delay, the decay envelope will have a very disturbing periodic beat. That frequency of the beat tone will be equal to the difference between neighboring resonances.

The need for randomizing in artificial reverberation systems has been well known but the techniques currently in use are either insufficient or have undesirable properties. Random delay is very difficult to implement in a digital signal processing environment because the interpolation between taps produces a high rapid time amplitude modulation of high frequency signals. Interpolation artifacts limit the use of the changing delays to be mostly outside of the major recirculation loop. This invention provides a new scheme for producing the desired statistics by changing the nature of the recirculation rather than by changing isolated delay values.

A multiplier can be used for two distinct purposes when one of the inputs is an audio signal. The second input can be a fixed number, which produces a linear scaling of the audio signal in the form of an attenuator or amplifier, or the second input can be another time changing signal, which creates a modulation process. While implemented in a similar fashion, they serve fundamentally different functions. An attenuator is not the same as an amplitude modulator. In this invention, each of the fixed constants in a mixer is replaced with a corresponding modulator. That modulator is driven by a process that creates continuously changing coefficients. When the process is correctly designed, the mixer continuously changes the topological connections between the energy transmission networks without producing any artifacts.

In one embodiment of the invention, the $n^2$ fixed coefficient multipliers of the static mixer with are replaced with corresponding modulators each having a second time varying input signal. As a black box, the complete modulation mixer should be considered as having n audio input signals, called the audio input vector, n audio output signals, called the audio output vector, and $n^2$ coefficient modulation input signals, called the coefficient modulation vector. The invention contains an additional network to drive the coefficient modulation vector so that the modulation signals are constrained to satisfy the energy conservation property of the audio output vector. When the energy in the audio output vector is constrained to be the same as the energy in the audio input vector, the modulation mixer can be used in the feedback recirculation topology of a reverberator containing a plurality of energy transmission networks. The modulation signals can be random, pseudo-random, or periodic but within the constraint.

The invention functions to randomize the topology of the recirculation. At different times, each of the energy transmission networks feeds a different amount of its energy to the other networks, including itself. Since these ratios change with time, the connections are thus randomized. At one instant of time, network 1 might feed 20% of its energy to itself, 40% to network 2, 10% to network 3, and 30% to network 4. At another instant of time, network 1 might feed 50% to itself, 5% to network 2, 25% to network 3, and 20% to network 4. As long as the distribution energy sums to a constant, namely 100%, such a structure will produce smooth reverberation decay. A large energy burst in one energy transmission network is relatively quickly distributed to the other networks.

The two parts of the invention are closely related in that the illustrative embodiment contains a modulation mixer, that is energy preserving. The modulation mixer is also combined with one or more energy transmission networks, each of which has a uniform energy decay rate. As a result, the reverberation decays uniformly; it is not degraded by either of the two processes. Neither the modulation process of the mixer nor the dispersion of the energy transmission networks produces spectral coloration of the reverberation time; but they both break up repeating patterns.

An implementation of the reverberation apparatus, as shown in FIG. 1, may be based on the single energy dispersive transmission network 31, comprising notchpass filter 26 and standard energy transmission network 29, embedded in a single feedback loop 32. The output of the energy dispersive transmission network 31 is coupled back to input adder 20 to form the main feedback loop 32. Feedback loop 32 recirculates the energy that enters from input 19 with a gradual decay determine by the coefficient gRT input of multiplier 28 and by the gain of notchpass filter 26. In the illustrative embodiment, delay 27 may be relatively long, ranging from 30 to 300 msec., while delay 23 may be typically set to a value of about 25% of delay 27. The composite delay of notchpass filter 26 and energy transmission network 29 determines how long it takes the energy to recirculate.

Notchpass filter 26 comprises a feedback loop around delay 23, multiplier 24 and adder 21. The amount of dispersion and the peak group delay is determined by the value of gP input of multiplier 24. The closer to 1.0, the larger the value. The feedforward path via multiplier 22 with coefficient gZ allows for controlling the gain minimum at those frequencies where the group delay peaks. FIGS. 5 and 6 illustrate the group delay and amplitude respectively as function of frequency for typical values of gZ and gP. The composite delay around the main feedback loop 32 comprises delay 27 and the group delay notchpass 26, while the composite gain around loop 32 comprises gRT and the gain of notchpass 26. Generally, reverberation time around a recirculating delay line is defined by Equation (1) below $$RT = \frac{-3 * T}{\log g} \tag{1}$$

where g is the composite gain and T is the composite delay. Given any two parameters, Equation (1) can be used to compute the third. The minimum group delay in the notchpass filter is defined by Equation 2 below $$T_{min} = \frac{1-g^2}{1+g^2+2g} * T_{ap} = \frac{1-g}{1+g} * T_{ap} \tag{2}$$

where $T_{ap}$ is the delay line in the notchpass filter and g is the average of gP and gZ, as defined in Equation (7). Similarly, the maximum group delay is defined by $$T_{max} = \frac{1-g^2}{1+g^2-2g} * T_{ap} = \frac{1+g}{1-g} * T_{ap} \tag{3}$$

Equations (2) and (3) represent the frequencies where the delay produces an out of phase condition and an in-phase condition, respectively. Notice that on a linear scale, Equation (3) dominates because $T_{max}$ rapidly goes to infinity as g approaches 1.0. At the frequency where the group delay is a maximum, the minimum gain is defined by Equation 4 below $$G_{min} = \frac{1-g_Z}{1-g_P} \tag{4}$$

where gZ is the gain coefficient for the zeros and gP is the gain coefficient for the poles. Similarly, the maximum gain is defined by Equation 5 below $$G_{max} = \frac{1+g_Z}{1+g_P} \tag{5}$$

at a frequency where the group delay is a minimum. When the energy storage network, having a gain of gRT, is combined with the notchpass filter, the composite g is equal to gRT*$G_{min}$ and gRT*$G_{max}$ for the minimum and maximum, respectively. Similarly the composite delay is $T_{RT}$+$T_{min}$ and $T_{RT}$+$T_{max}$ for the same two cases where $T_{RT}$ is the delay of the energy storage network. Since both the composite gain g and composite delay T are a function of frequency, the values of gP and gZ are selected so that RT is remains constant. Effectively, Equation (1) is solved twice, once at the in-phase frequency and once at the out of phase frequency.

The values of delay 27, delay 23, gain gRT, and g are design choices with a set of reasonable values being 100 msec, 25 msec, 0.7, and 0.5, respectively. The equations are then used to compute the values of gP and gZ. Equations (2) and (3) evaluate directly since all of the independent parameters are given. The differences between gP and gZ is approximately given by Equation (6) below $$g_Z - g_P = (1-g)\left(1 - \frac{1}{g_{RT}} * 10^{\frac{-3(T_{max}+T_{RT})}{RT}}\right) \tag{6}$$

which can be used to determine gP and gZ when equation (6) is added or subtracted from the definition of g by Equation (7) below $$g_Z + g_P = 2 * g \tag{7}$$

A numerically exact solution can be obtained by using any number of mathematical tools such as Mathcad software, commercially available from MathSoft, Inc., Cambridge, Mass. 02142, but Equation (6) is almost perfect because $G_{max}$ is both very close to 1 and not very sensitive to changes in the gZ and gP values. An alternative solution method requires the computation to be done twice, initially assuming $G_{max}$, is 1, and then using the actual $G_{max}$ based on the previously computed values of gP and gZ. When these values are used in the system of FIG. 1, energy will recirculate and decay at a constant rate for all frequencies. Those frequencies having a longer delay will also have a higher attenuation.

The same result will be achieved if notchpass filter 26 is replaced with any of the alternative implementations shown in FIGS. 2–4 or 10. The notchpass filter may be implemented as a linear, time-invariant filter, which can be described in terms of its poles and zeros. The location of the poles and zeros in the circular Z plane for sampled data systems, or in the rectangular S plane for continuous systems, complete defines the resulting filter. Each of the topologies may have at least two independent gains and at least one delay line.

Figure 2:
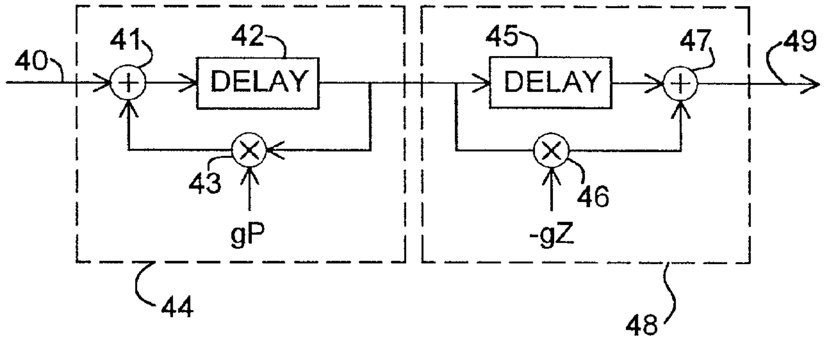
FIG. 2 is a block diagram illustrating an implementation of a notchpass filter where the module for implementing the filter poles is distinct from the module to implement the filter zeros.

FIG. 2 illustrates an alternative embodiment of the notchpass filter of FIG. 1. In this embodiment, filter network 44 which implements the poles is separated from filter network 48 that implements the zeros. The output from filter network 44 feeds filter network 48, but the same result is achieved if filter network 48 feeds filter network 44. Delays 42 and 45 have approximately the same delay values in order to make the delay maximums coincide with the same frequency of the gain minimums. The multiplier 43 is used to set the pole value gP. Multiplier 46 is used to set the zero value gZ. Adder 41 completes the feedback path for the poles and adder 47 adds the direct and delayed signals to create the zeros. Note that adder 25 of FIG. 1 and adder 47 are both adding the same signals.

Figure 3:
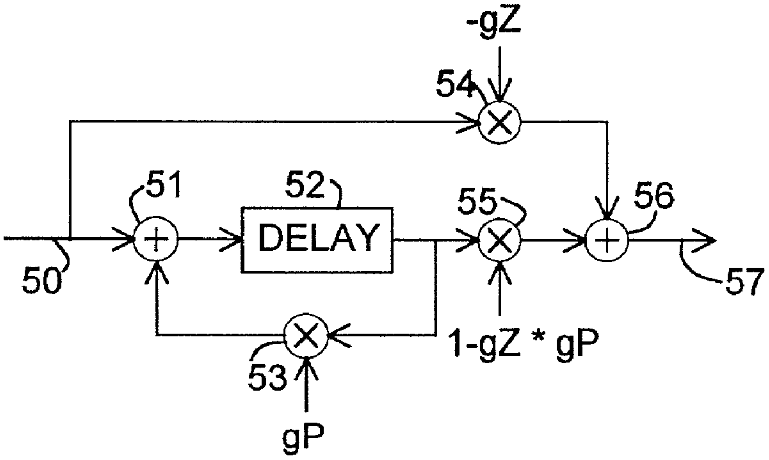
FIG. 3 is a block diagram illustrating an alternate implementation of a notchpass filter with the inner loop producing the filter poles and an outer feedforward path producing the filter zeros.
Figure 4:
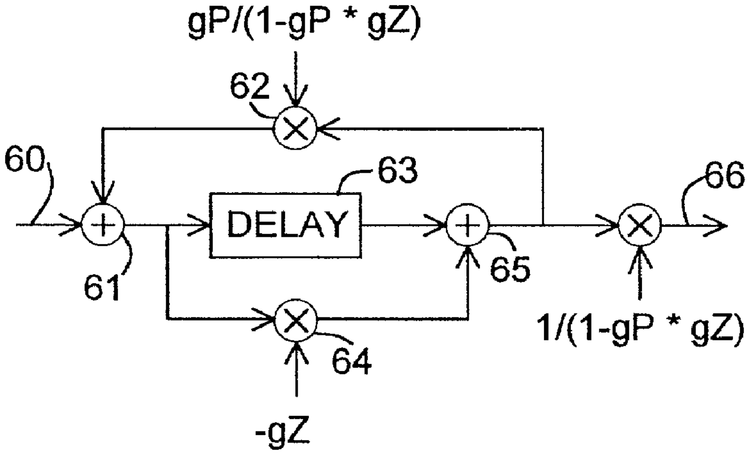
FIG. 4 is a block diagram illustrating an alternate implementation of a notchpass filter with an inner feedforward path to produce the filter zeros and an outer feedback loop to produce the filter poles.

FIGS. 3 and 4 show alternative implementations of the notchpass filter of FIG. 1. Delays 52 and 63 may have the same value. Both topologies have a feedback loop created by multiplier 53 with adder 51 and multiplier 62 with adder 61. Both have a feedforward path created by multiplier 64 with adder 65 and multiplier 54 with adder 56. The actual values for the multiplier coefficients are shown in terms of the basic poles location gP and zero location gZ. Of the four implementation shown in FIGS. 1–4, generally the configuration of FIG. 1 is more versatile but different applications may make the alternative topologies more efficient.

In the invention, the notchpass filter parameters are adjusted to produce a group delay and amplitude characteristics shown in FIGS. 5 and 6. The group delay may have has a very wide range, often with a maximum to minimum ratio of as much as 25:1. When the notchpass filter's group delay is combined with the larger delay of the energy transmission network, the composite delay variability is greatly reduced. The notchpass filter's gain minimums are typically on the order of 0.8 and its maximums may be very slightly above 1.0, with the exact values dependent on the parameters. These values are for illustrative purposes only.

Figure 7:
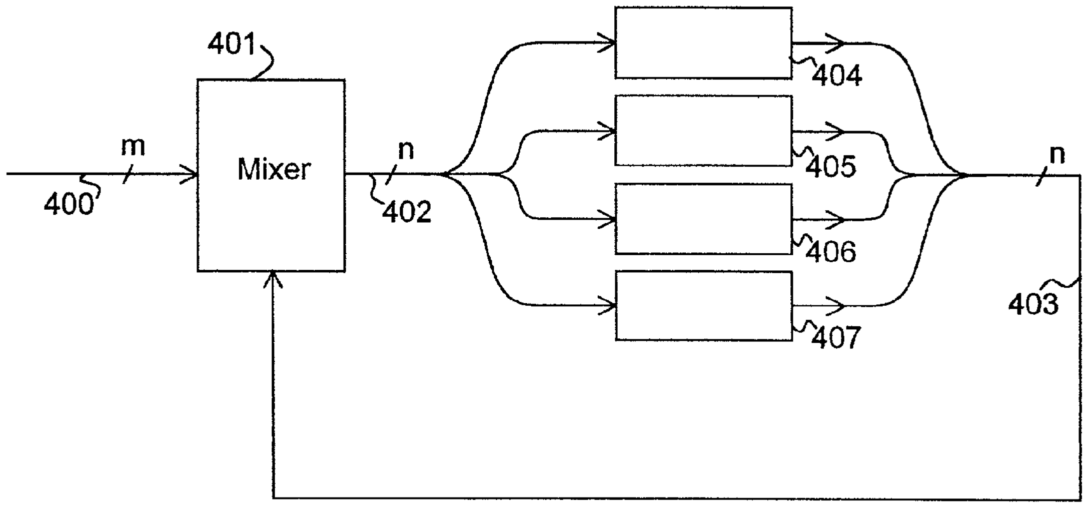
FIG. 7. is a block diagram illustrating a reverberator with four energy dispersive transmission networks connected with feedback using a mixer to combine the n outputs with the m inputs to create the n source signals to feed the four network inputs.

The more general case of feedback using the energy dispersive transmission networks is shown in FIG. 7 with four such networks 404, 405, 406, and 407. The n outputs in signal path 403 are connected to mixer 401 that combines the n signals with one or more of the m inputs in signal path 400 to create the n inputs in signal path 402. The mixer adds and scales one or more of the signals in signal path 403 with one or more of the inputs in signal path 400 for each signal in signal path 402. By changing the nature of the mixer, the connections illustrated in FIGS. 8 and 9 can be created. Typically, mixer 401 is of the energy preserving type.

Figure 8:
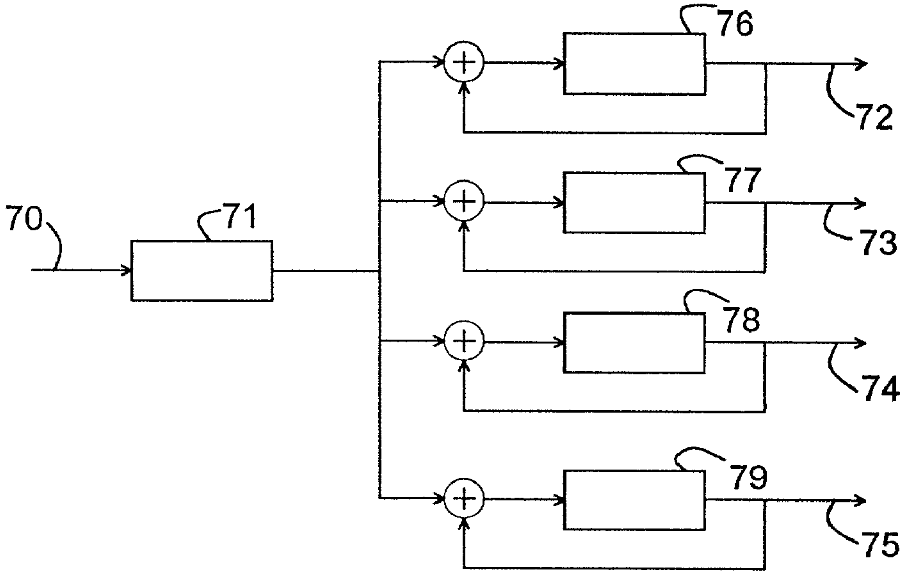
FIG. 8 is a block diagram illustrating a reverberator with a plurality of energy dispersive transmission networks in parallel.
Figure 9:
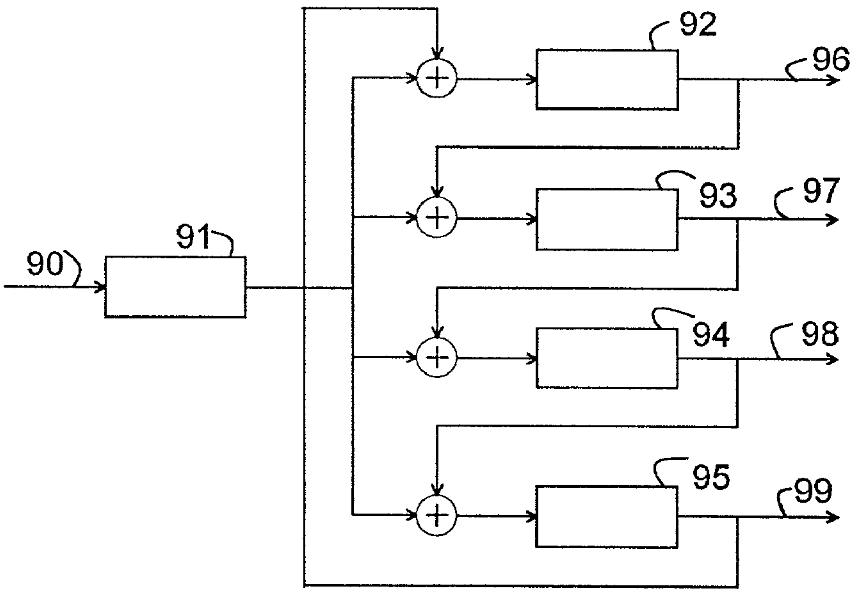
FIG. 9 is a block diagram illustrating a a reverberator with a plurality of energy dispersive transmission networks in a single large loop.

Applications for the energy dispersive transmission network are shown in FIGS. 8 and 9. These are real reverberation topologies that traditionally used a standard energy transmission network. Elements 76–79 and 92–95 may be implemented with the energy dispersing transmission network 31 of FIG. 1 or with the modified notchpass filter design of FIGS. 2–4 and 10. In FIGS. 8 and 9 the energy dispersive transmission networks may be of identical design, but with different parameters. The topologies of FIGS. 8 and 9 both will produce quality reverberation. The four output channels 72, 73, 74, and 75, for the parallel design, and outputs 96, 97, 98, and 99 for the large loop, can either feed four loudspeakers or can be mixed to provide a stereophonic or monophonic output. The input is shown as monophonic signal 70 and 90 but can be expanded to include provisions for a multiplicity of inputs. These architectures may have other optional pre-processing elements 71 and 91, including one or more allpass filters, lowpass filters, etc.

In order to duplicate the gradual decrease in RT with increasing frequency, a very gentle lowpass filter replaces the gRT coefficient of multiplier 28 of FIG. 1. The exact shape of that lowpass may be controlled by the user, e.g. from the front control panel. Given the advantages of avoiding a comb shaped response in RT, a matching frequency dependence may replace the gZ coefficient of multiplier 22. While somewhat arbitrary, the matching filter is constrained by the set of equations (1) through (7). Such filters have no required topology.

Figure 10:
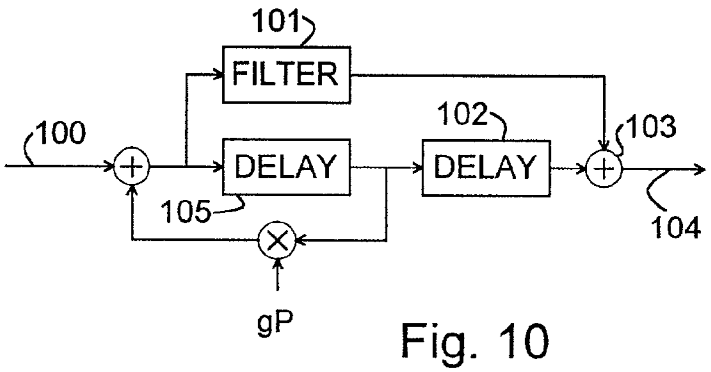
FIG. 10 is a block diagram illustrating a notchpass filter modified to allow for a frequency dependent notch depth, that may be needed to implement a reverberation time as a function of frequency.

FIG. 10 illustrates an alternative design of a notchpass filter. Filter 101 replaces gZ and can be implemented as a standard FIR type (finite impulse response) of any odd order. The order is the number of taps. If those coefficients in filter 101 are symmetric, the filter is phase linear, which can be modeled as a simple delay. Delay 102 may be inserted to match the delay of filter 101. Both signal paths entering adder 103 may have the same phase. Hence, the filter is equivalent to a frequency dependent gZ. In practice, the delay line in filter 101 and delay 102 are merged with delay 105 in a single element to save computation time and are shown separately for illustrative purposes.

Figure 11:
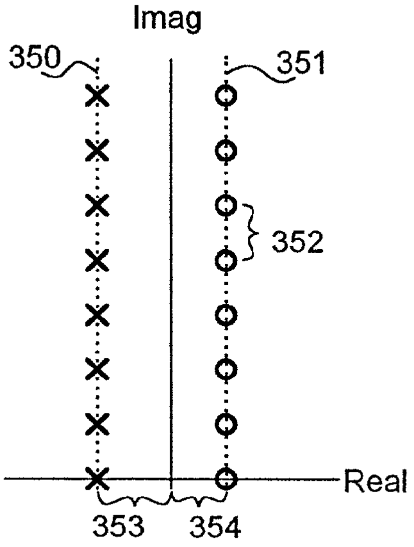
FIG. 11 is an s-plane representation of the pole-zero pattern for the inventive notchpass filter designed to work with an energy transmission network that has a flat frequency response.
Figure 12:
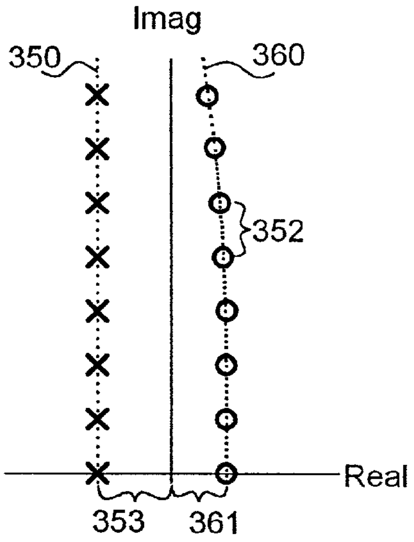
FIG. 12 is an s-plane representation illustrating a modification of the real part of the line of zeros for various filters that might be used in the energy transmission network.
Figure 13:
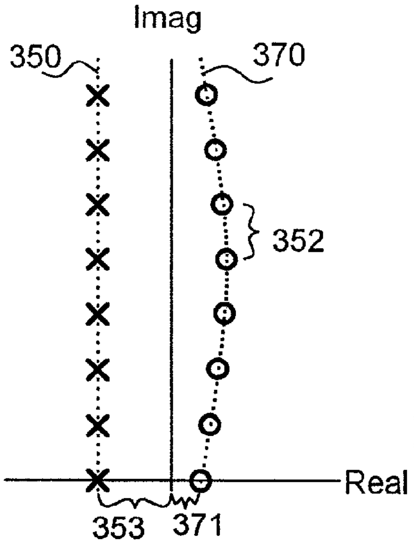
FIG. 13 is an s-plane representation illustrating a modification of the real part of the line of zeros for various filters that might be used in the energy transmission network.

The inventive notchpass filters, regardless of the implementation or topology, can be described using standard signal processing notations in the form of the s-plane representation for continuous-time systems, or, in the form of the z-plane representation for discrete time systems. It is well known that s-plane and z-plane representations are equivalent. It is also well known that a linear, time-invariant filter can be converted to one of these two representations. The notchpass filters described herein can be equivalently described either in terms of the s-plane poles and zeros or in terms of a network diagram. In the s-plane representation, the poles of the notchpass typically appear on a vertical line and are equally spaced along the vertical or imaginary axis. The zeroes are also on a line but, unlike the poles which are in the left half plane, the zeros are in the right half plane. The line of zeroes is typically closer to the vertical axis than the line of poles in order to achieve the periodic comb-like attenuation of the notchpass filter. FIGS. 11 to 13 only show the upper two quadrants of the s-place because the lower two quadrants are mirror images of the upper quadrants. Poles and zeros appear as complex conjugates of each other, except if there is a single pole and zero at Direct Current.

FIG. 11 illustrates the location of the poles and zeros for a notchpass filter in accordance with the present invention. The pole line 350 contains a sequences of poles with the real part 353 which is determined by the feedback gP and zero line 351 contains a sequence of zeros with real part 354. Both poles and zeros are spaced the imaginary frequency distance 352 that is determined by the size of the delay line. In the illustrative embodiments of the inventive notchpass filter, there is typically a pole with the same imaginary frequency as the corresponding zero. As used herein, especially with reference to the s-plane representation of FIGS. 11–13, the term “line” is not limited to a straight line.

When the gRT has been replaced by a filter, and when the notchpass is modified to take this property into account, the poles or the zeros will typically no longer be on a straight line. FIG. 12 and FIG. 13 illustrate two examples of a bent line of zeros to achieve optimum ripple free results. The shape of the bend is determined by the nature of the filter that replaced gRT. Bending the zero line is equivalent to bending the pole line since the attenuation is determined by the ratio of the real part of the zeros to the real part of the poles. Increasing one distance is equivalent to decreasing the other. In FIG. 12, the zero line distance from the imaginary axis starts at the value of 361 and gradually decreases along line 360. In FIG. 13, the zero line distance starts at the value of 371, gradually increases, and then decreases along line 370.

While optimum ripple free reverberation time is desirable, economic considerations may allow more ripple. Such would be the case when gRT had been replaced by a filter, but the line of poles and zeros was left straight as shown in FIG. 11. With an optimum design, the comb-like attenuation ripples illustrated in FIG. 6 are made to vary with frequency by applying equations (1) to (7) at each frequency. Generally, the frequency changes in RT are sufficiently gentle that these equation only need be applied at a few select frequencies. With a non-optimizes design, the ripple depth may be constant as shown in FIG. 6.

Figure 14:
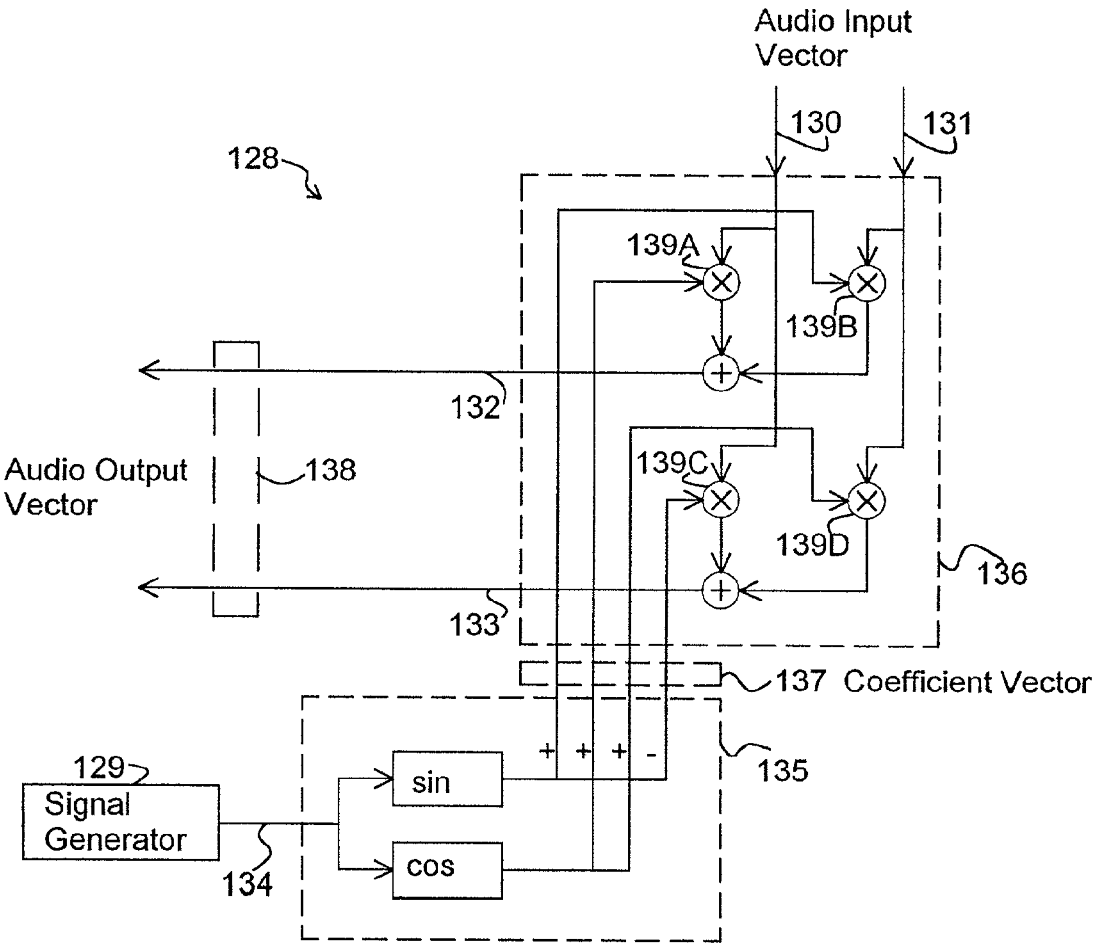
FIG. 14 is a block diagram illustrating a 2×2 energy conserving modulation mixer that can be used by itself or as a building block to create higher order modulation mixers.

FIG. 14 illustrates a 2×2 modulation mixer 128. Mixer 128 can be used by itself, or can be used as a building block to create higher order mixers. An input audio vector, composed of audio signals 130 and 131, feeds the four modulators multipliers 139A–C, that are driven by the coefficient vector 137 to create an audio output vector, composed of output signals 132 and 133. The energy in the audio output vector is typically the same as the energy in the audio input vector as long as the coefficients are created by network 135. Energy conservation comes from the simple trigonometric rule:

$$\sin^2+\cos^2=1$$

for all angles.

The modulation process comprises modulation multipliers 139A, 139B, 139C, and 139D in mixer 138. The randomization signal which appear at input 134 is created by signal generator 129. Within converter 135 the randomization signal 134 is supplied to trigonometric functions, that given an input value, generate a corresponding function value as the output thereof. Such trigonometric outputs serve as the coefficient vector 137 by which the audio input vector is modulated by the modulation mixer 136. The resulting output audio vector 138 comprises signals 132 and 133. In FIGS. 9–15, circuit paths that cross are not assumed to be connected.

Figure 15:
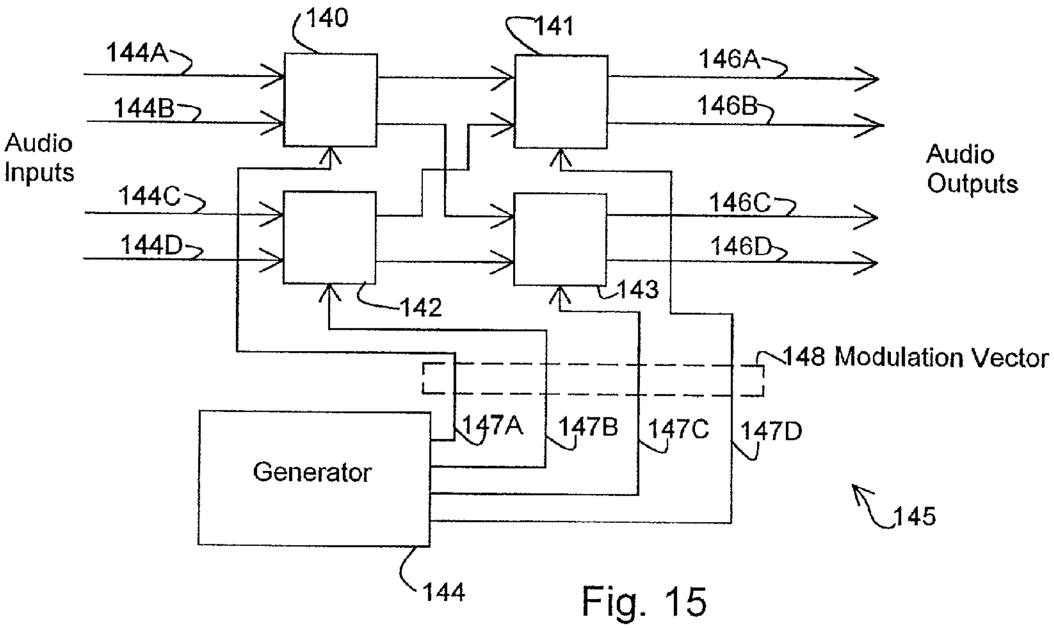
FIG. 15 is a block diagram illustrating four sets of 2×2 energy conserving modulation mixers connected to form a 4×4 version, with a generator to create the modulation signals.

FIG. 15 illustrates a 4×4 modulation mixer 145 using four modulation mixers 140–143, each of which includes a coefficient converter and modulation mixer, similar to converter 135 and modulation mixer 136, respectively of FIG. 14. Since each basic modulation mixer is energy conserving, pairs of signals can be passed through any number of the devices. Modulator mixers 140 and 142 each randomize pairs of the input signal while modulation mixers 141 and 143 randomize their corresponding outputs. The input audio vector comprises the four input signals 144A, 144B, 144C, and 144D, while the resulting output audio vector comprises signals 146A, 146B, 146C, and 147D. The four randomization signals 147A, 147B, 147C, and 147D are created by generator 144. The approach shown in FIG. 15 is a two-stage implementation. An infinite 1 variety of configurations can be created cascading any number of modulation mixer. A $5^{th}$ modulation mixers could be added to the outputs, or the $4^{th}$ mixer removed. The amount and type of randomizing may be left to the designers choice. Generally, it is desirable to have as few modulation mixer stagers as possible while still randomizing most or all the audio input signals. Moreover, by keeping the number of cascading generations to a small value, there is no build up of modulation sidebands.

Figure 16:
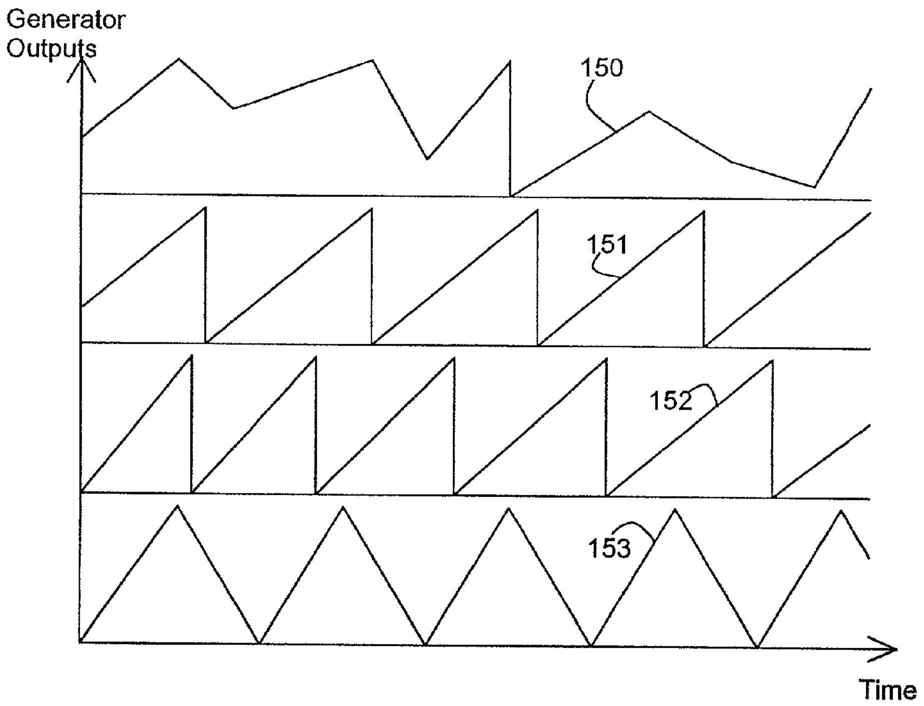
FIG. 16 is a graph illustrating samples of generator signals that can be used to drive a modulation mixer to produce random topology changes.

FIG. 16 illustrates typical signals 150–153 that may be used to drive the modulation mixers 140–143 of FIG. 15. In this figure, the input signal is viewed as having phase units, namely that the signal runs from 0 to 360 degrees and then wraps back to 0. Using a phase wrapping notation is not a requirement but simplifies the implementation. In digital signal processing, wrapping can be easily achieved by making the largest fixed-point digital number correspond to 360 degrees and the smallest correspond to 0. Since fixed-point digital numbers wrap, phase wrapping happens automatically. Signal 150 is shown having a random slope that changes at random intervals. Such a signal will result in coefficients that appear to be a sequence of random sinewave segments at different frequencies. Signal 151 is shown as a pure linear phase that creates a sinewave coefficient. Signal 152 is shown with a linear increasing slope, which corresponds to a sawtooth wave. Signal 153 is shown as a triangle wave. A band limiting a random number generator may also be used as modulation source. Experience shows that even four periodic phase signals at four different frequencies work acceptably with no perceptual repeat. Values of 0.3, 0.6, 1.1, and 1.8 Hz are plausible choices for frequency. There is no restriction to the wave shapes or specific frequencies that can be used in generator 144.

Figure 17:
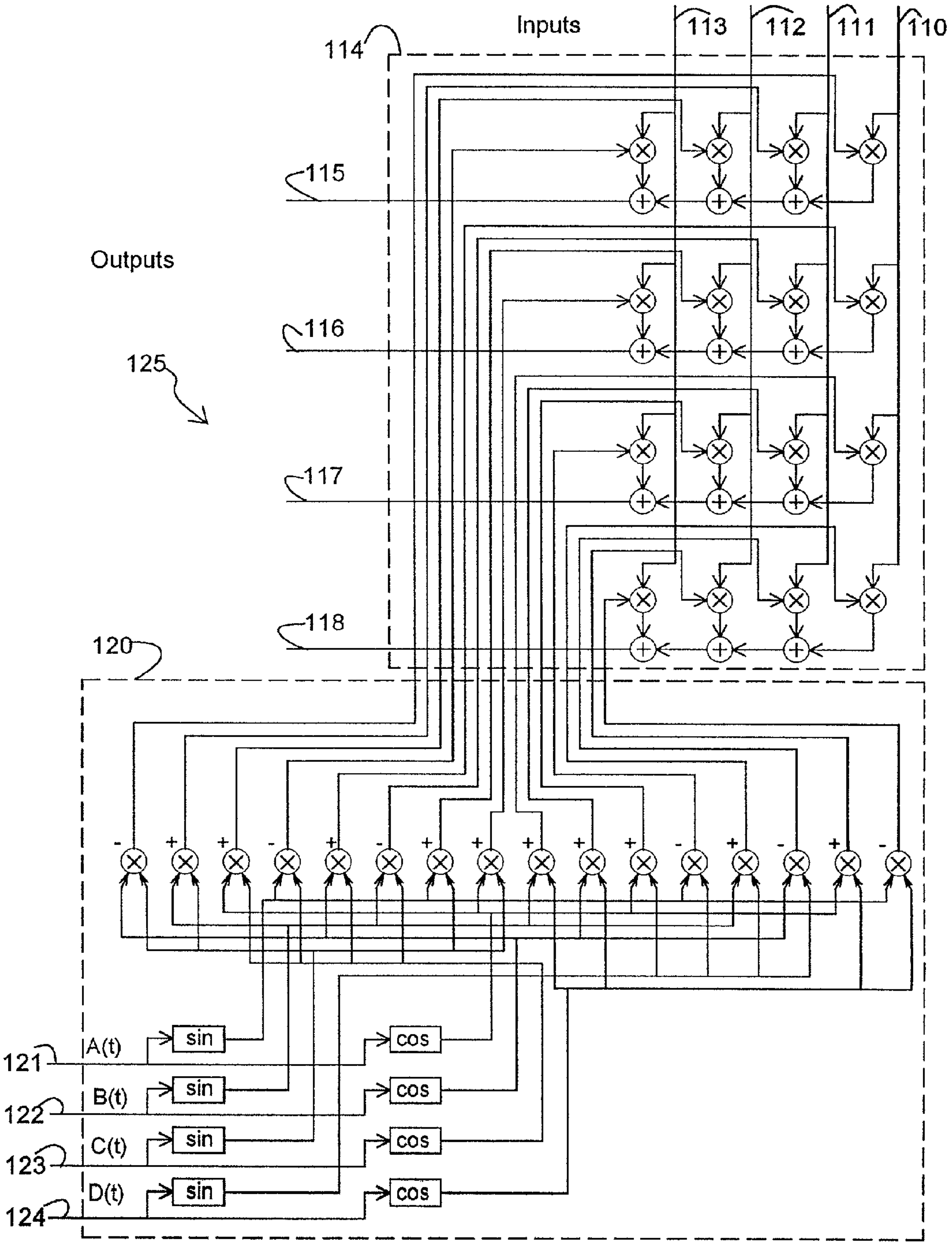
FIG. 17 is a block diagram illustrating additional detail of a 4×4 energy preserving modulator having sixteen modulators and obtaining a coefficient generator from the four modulation signals.

FIG. 17 illustrates the implementation of a 4×4 modulation mixer 125. An input vector, comprising audio input signals 110, 111, 112, and 113, feeds the 16 modulators that create an audio output vector comprising signals 115, 116, 117, and 118. A modulation vector, comprising modulation inputs 121, 122, 123, and 124, provides the basis from which coefficients are generated by generator 120. Generator 120 may implement the two mathematical rules for energy conservation. The magnitude of the vertical coefficient vector should be 1.0 at all times, and the dot product of all the vectors with each other, except itself, should be 0.0 at all times. The design shown in generator 120 is an expansion of the connection of 2×2 modulation mixers shown in FIGS. 14 and 15. As illustrated in FIG. 17, generation of the coefficient values is partially achieved with trigonometric functions prior to scaling.

Figure 18:
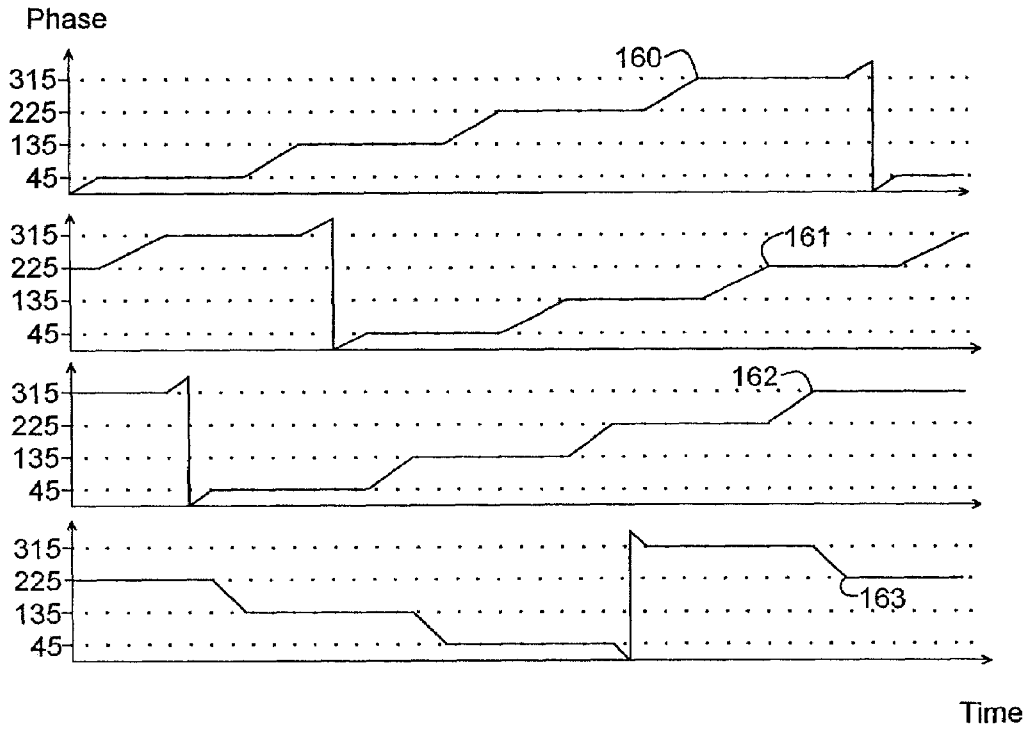
FIG. 18 is a graph illustrating the modulation signals with each signal having a different rate, but only one signal changing at each instant of time, and each signal stopping when hitting a threshold corresponding to 45, 135, 225 or 315 degrees.

FIG. 18 illustrates other modulation signals 160–163. Each of the four signals shown has a different slope corresponding to a different frequency. Only one signal changes at each instant of time and runs until hitting the threshold of 45, 135, 225, or 315 degrees. After the running signal reaches its stopping point, the next signals starts changing. The signal 160 is shown hitting the threshold of 315 degrees, which then results in signal 161 running until 215 degree threshold. The process continues at the reference points of signals 162 and 163. In this example, the start-stop algorithm is sequential and follows a fixed order. The order shown is 1, 2, 3, and 4 with repeat. Alternatively, the start-stop ordering be random, or the slopes may be random. The major advantage of the sequential generator is that only one modulation process is active at a given time. The start-stop approach not only reduces the computation burden but allows the spectral spreading to be controlled explicitly. In FIG. 15, the modulation products of 140 add to those of 141 if both modulation inputs are changing at the same time. In an alternative implementation, the modulation signals 160–163 be sub-sampled, and can run at half or a quarter of the rate of the audio signal since they are low frequency signal.

The major advantage of the start-stop algorithm is that it avoids a defect when using periodic or random signals as the source of the modulation coefficients. A mixer produces the maximum amount of energy spreading when all of the coefficients have a value of +/−0.5; each energy transmission network feeds 25% of its energy to each network. The mixer produces the least amount of mixing when all of the four diagonal terms are 1.0 and all off-diagonal terms are 0.0. Each network feeds 100% of its energy to itself and none to the others. Because of the randomization, the mixer will occasionally exist in one state and occasionally in the other. A given musical note may be perceived differently in these two extreme cases. The start-stop algorithm solves this problem because the four thresholds all correspond to coefficients with a magnitude of 0.5. Only the running signal is not at one of these thresholds.

The nature of the phase randomization signals is critical to the operation of the invention. If they are changing too slowly, there will be no perceived randomization of the reverberation topology. If they are changing too rapidly, there will undesirable modulation artifacts introduced, i.e. new spectral side-bands are created. The higher the modulation frequency, the more spectral spreading. The amplitude and phase of natural reverberation also has also has spectrum spreading. The randomization signals should be selected to match the spreading that would appear in natural reverberation, which is a function of the RT. For typical reverberation times, the spreading corresponds to a spectrum between 0.3 to 3 Hz. Hence, the randomizer should be adjusted to produce a similar amount of spectral spreading. Phase randomization signals may generally be in the range from 0.3 to 3.0 Hz, to make the reverberation tail have an unstructured and non-periodic personality.

Figure 19:
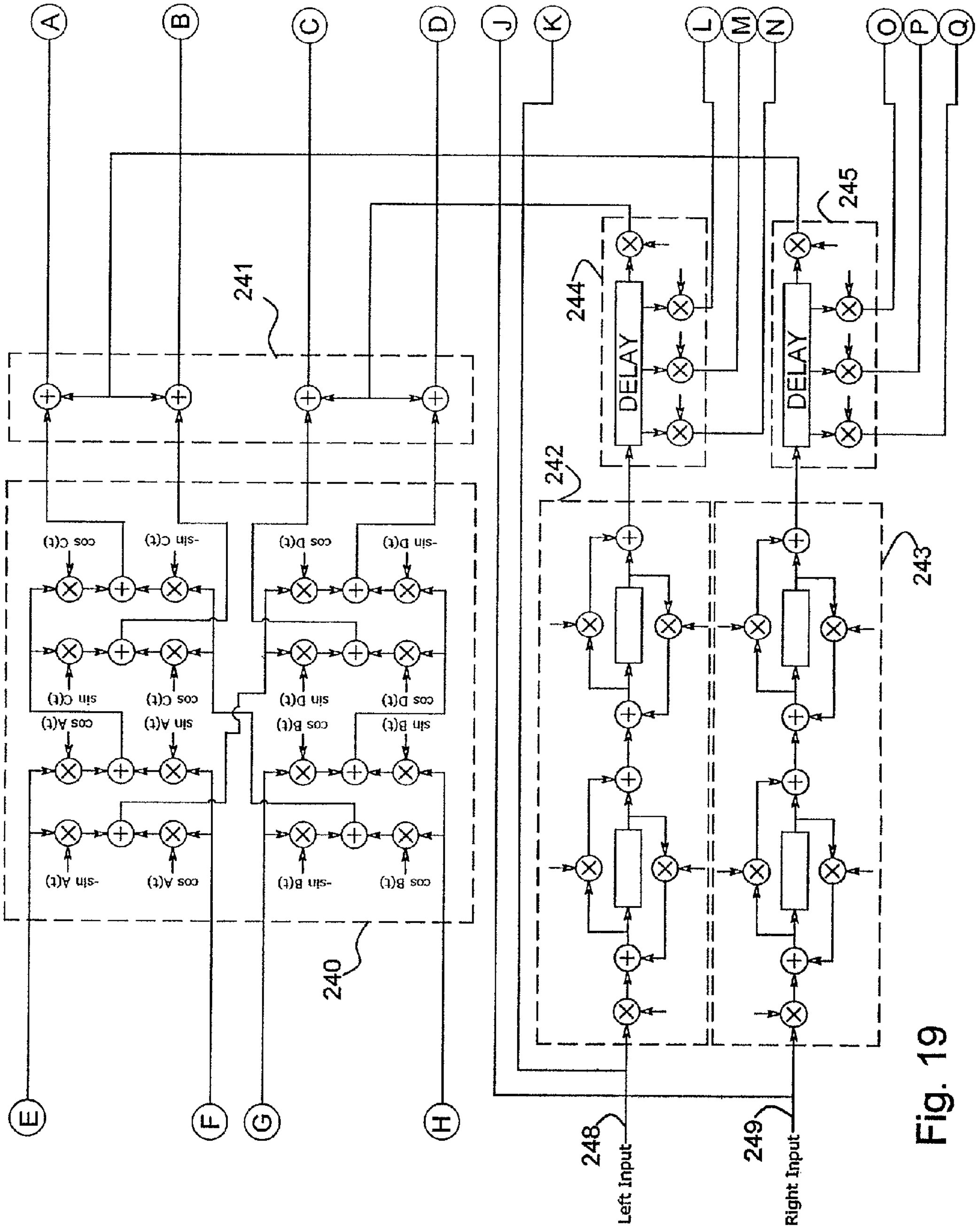
FIGS. 19–21 collectively form a block diagram illustrating a reverberation system using the dispersive energy transmission networks and the randomizing modulation mixer of the present invention.
Figure 20:
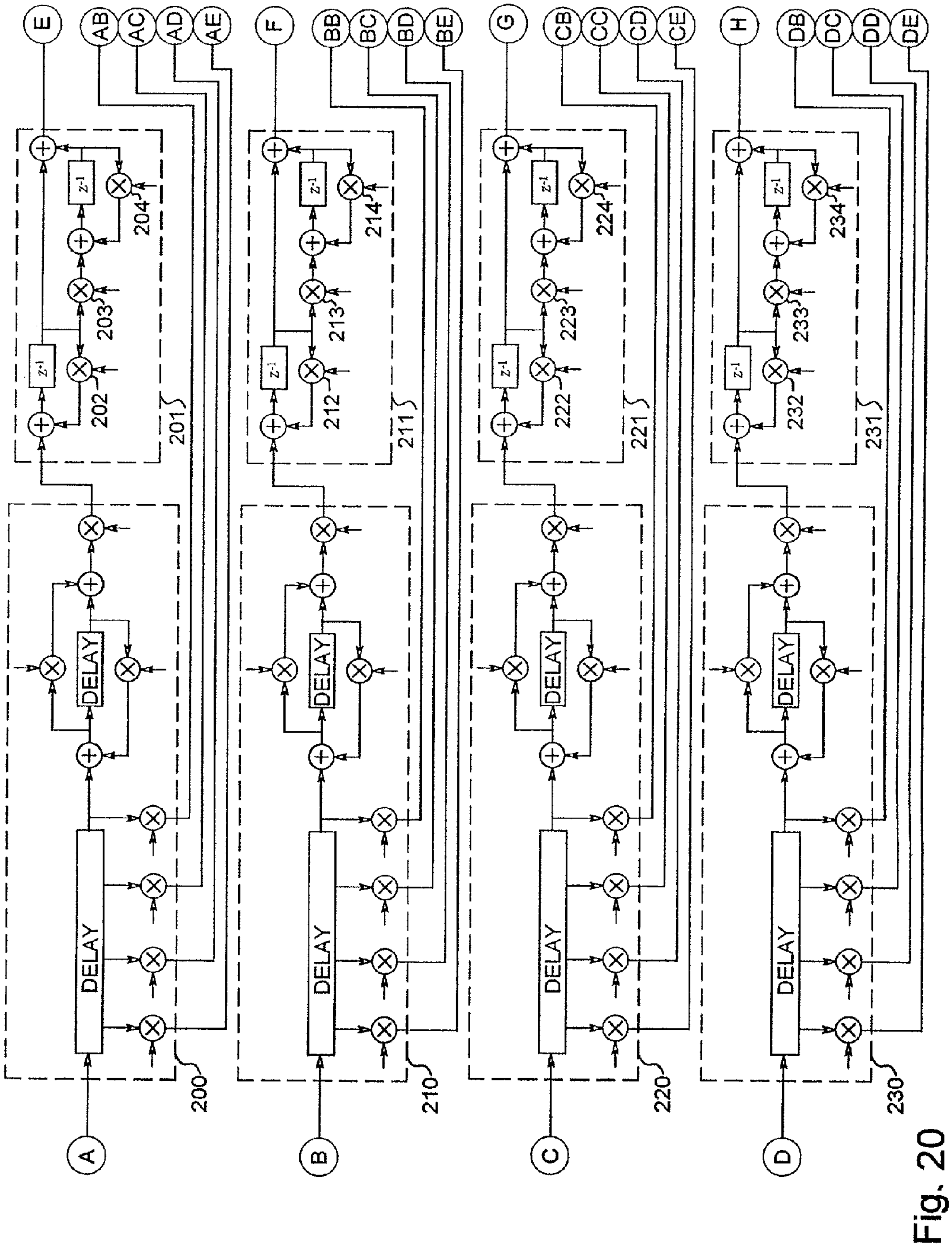
Figure 21:
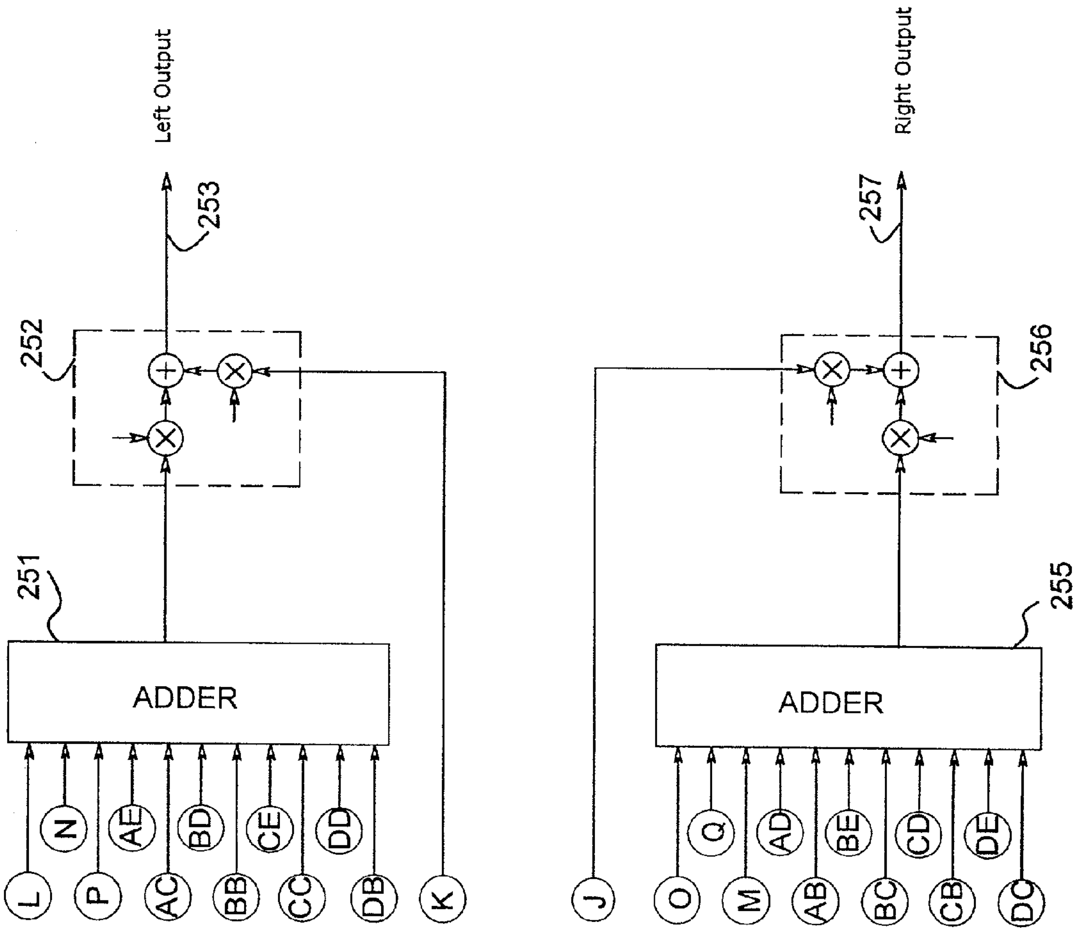

FIGS. 19, 20 and 21 show an alternative embodiment containing both the energy dispersive transmission networks, described previously with reference to FIGS. 1–10, and the random modulation mixer, described previously with reference to FIGS. 14–18. Stereo audio input signals are fed into lines 248 and 249 where they are diffused by allpass networks 242 and 243, respectively, each of which has two allpass filter diffusors. The outputs of networks 242 and 243, respectively, feed delay lines 244 and 245 to allow for unreverberated delayed signals to be fed directly to the output. Lines L, M, N, 0, P and Q appear directly in the output summations 251 and 255. This kind of preprocessing is typical of reverberation system, representing a simulation of the individual early reflections. The choice of preprocessing is based on the type of acoustic space and the location of the listener. In the early reflections, the statistics process has not yet begun. The randomization modulation mixer 241 is part of the main recirculation loop that includes four sections of processing. The four sections comprise the energy dispersive transmission networks 200, 210, 220, and 230, as well as filtering sections 201, 211, 221, and 231. Networks 200, 210, 220, and 230 may be implemented with the energy dispersing transmission network 31 of FIG. 1 or with the modified notchpass filter design of FIGS. 2–4 and 10. Filtering sections 201, 211, 221, and 231 may implement a frequency dependent reverberation time by changing the gRT for high and low frequencies. The feedback path 202, 212, 222, and 232 around a unit delay of a respective filter section implement a $1^{st}$ order lowpass filter that serves to reduce the feedback of high frequencies. The feedback path 204, 214, 224, and 234 around another unit delay of a respective filter section create a lowpass filter at very low frequencies, typically 200 Hz. By adjusting gains 203, 213, 223, and 233, the amount of low frequency RT can be adjusted separately from the amount of high frequency RT. Each of the main delay lines 200, 210, 220 and 230 in the energy dispersive transmission networks is shown with four taps, each feeding the output summation networks 251 and 255. These summation networks represent the fully reverberated signals from the recirculation networks. Finally, the ratio of reverberation to dry input signal is adjustable by mixers 252 and 256 to form the stereo output signals 253 and 257.

Any of the signal processing circuits and, including the inventive notchpass filter, energy dispersive transmission networks, and modulation mixer shown in FIGS. 1–22 may be implemented using a commercially available Digital Signal Processor (DSP) integrated circuit, such as the Motorola 56004 chip from Motorola, Inc, Schlumberger, Ill., The published programming instructions and library routines for such DSP may be used to construct algorithms which function according to the illustrated signal processing circuits, such algorithms being within the scope of those skilled in the arts in light of this invention. Other products with in the Motorola 56000 family of products may be similarly used. In addition, DSP product from other manufactures, such as the SHARC Series, commercially available from Analog Devices, Norwood, Mass., the TMS 320 Series, commercially available from Texas Instruments, Dallas, Tex., may be similarly used, or any other available DSP product may be used to implement this invention.

An application will often have additional processing components inserted at various point, e.g. there may be components of the energy dispersive transmission network inter-mingled with other functional blocks. In some cases, the functionality is implicit. For example, the main attenuation can be embedded within the notchpass filter without being explicitly represented. These variations do not change the basic invention but are designers implementation preferences.

The actual parameters in the embodiment are a few strong function of the application. Is the system to simulate a symphony hall, a bathroom, a train station, a small chamber or an opera hall? Is the listener sitting close to the stage or in the $3^{rd}$ balcony? Is the music classical, popular or hard rock? The number of questions is so large, and each of the answers determines the optimum settings for the network parameters. Furthermore, economic considerations determine the amount of signal processing that can be used. The design shown in FIG. 20 has four outputs of delay taps on each of the four delay sections. Should there be more processing resources, more taps may be added. With less resources, three taps might be used instead of four.

In the preferred embodiment, additional optimization can be performed to achieve better performance. Smoothness in the reverberation decay can be improved if the energy in each 1 msec. interval is essentially the same as the neighboring intervals. To use this approach, the proposed design is simulated in a computer with starting values for all parameters. An impulse is entered into the input and the complete output is analyzed as a sequence of 1 msec. windows. This represents the average energy or amplitude in the output envelop. A metric such as the peak variation in envelop or the power in the envelop is applied to the output to create a figure of merit. The process is repeated a large number of times with each iteration using slightly different design parameters. This is known as a Monte Carlo simulation.

A simple example illustrates the process. Consider having 4 parameters that need to be optimized and that each parameter can have 3 values. The middle value is the starting reference and each of the other values represents an incremental increase or decrease in that value, for example, 1% change. Since each of the 4 parameters can each have one of three possible values, there are a total of 34, or 81 cases. After the figure of merit has been computed for each, the optimum is selected as the new starting reference and the process repeats. One of those 81 cases will be more optimum than all the others. Because computers are so inexpensive, a very large system can be so optimized by long computer runs. There are many other equivalent numerical techniques that can be used. The exact technique for finding the optimum is not important. It is important that the reverberation decay have minimum energy variations in the envelop over a 1 msec. averaging window. The size of the window is not critical since it is only an approximation to human hearing.

Figure 22:
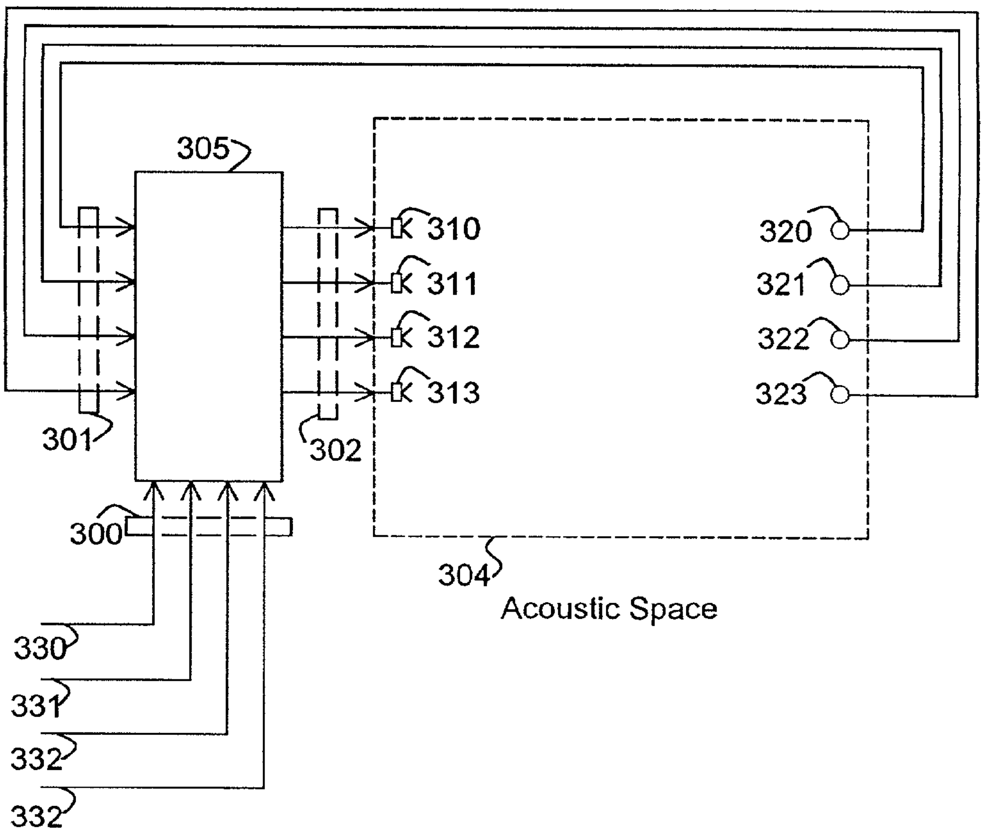
FIG. 22 is a block diagram illustrating a 4×4 modulation mixer with an audio output vector supplied to loudspeakers, which in conjunction with an acoustic space and microphones, function as an energy transmission network.

FIG. 22 illustrates a 4×4 modulation mixer 305 with audio output vector 302 feeding four loudspeakers 310, 311, 312 and 313 located in an acoustic space 304, such as concert hall. The four microphones 320, 321, 322, and 323 send their signals back to modulation mixer 305 as the audio input vector 301. The mixer 305 is driven by four randomizer signals 330, 331, 332, and 333 in the modulation vector 300. The audio source, not shown, may be located inside of acoustic space 304. Alternatively, a prerecorded audio signal can be supplied to the loudspeakers. In this embodiment, the loudspeakers, acoustic space and microphones function as an energy transmission network, as an alternative those purely electronic implementations described herein.

A software implementation of the above-described embodiments may comprise a series of computer instructions either fixed on a tangible medium, such as a computer readable media, e.g. diskette, CD-ROM, ROM, or fixed disk, or transmittable to a computer system, via a modem or other interface device, such as communications adapter connected to the network over a medium. Such medium can be either a tangible medium, including but not limited to optical or analog communications lines, or may be implemented with wireless techniques, including but not limited to microwave, infrared or other transmission techniques. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, preloaded with a computer system, e.g., on system ROM or fixed disk, or distributed from a server or electronic bulletin board over a network, e.g., the Internet or World Wide Web.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A processing system capable of electronically generating reverberation signals having a decay rate, the system comprising:

(A) a notchpass filter for receiving a signal and generating an output signal, comprising:

a first module for delaying the signal by a first delay value;

a first multiplier for scaling the signal according to a first gain; and a second multiplier for scaling the signal according to a second gain, where the first module and first and second multipliers are operatively coupled to form a first signal processing circuit path, the notchpass filter having a comb filter amplitude and delay output response characterized by a plurality of delay maximum at certain frequencies and a plurality of gain minimum at said certain frequencies;

(B) an energy transmission network for receiving the output signal from the notchpass filter, the energy transmitting network comprising:

a second module for delaying the signal by a second delay value; and a third multiplier for scaling the signal according to a third gain, where the second module and third multipliers are operatively coupled to form a second signal processing circuit path that both delays and scales the received signal;

the values of the first and second gain have a defined relationship with the first and second delay values and the third gain; and the combined notchpass filter and energy transmitting network have an amplitude output response characterized by a plurality of gain minimum at the same frequencies as a plurality of delay maximum so that the decay rate is substantially identical at all frequencies.

2. A method for electronically generating reverberation signals having a decay rate, the method comprising:

(A) providing a notchpass filter in combination with an energy transmission network where the notchpass filter comprises:

a first module for delaying the signal by a first delay value;

a first multiplier for scaling the signal according to a first gain; and a second multiplier for scaling the signal according to a second gain;

the first module and first and second multipliers operatively coupled to form an signal processing circuit path, the notchpass filter having a comb filter amplitude and delay output response characterized by a plurality of peak delay maximum at certain frequencies and decreased gain minimum at the same certain frequencies;

the energy transmitting network comprising:

a second module for delaying the signal by a second delay value;

a third multiplier for scaling the signal according to a third gain; and the second module and third multipliers operatively coupled to form a signal processing circuit path that both delays and scales the received signal;

(B) calculating modified first and second gain value from the first and second delay values and the first, second and third gain; and (C) applying the modified first and second gain value to the first and second multipliers, respectively, so that, in response to modified first and second gain, the combined notchpass filter and energy storing network has an amplitude output response characterized by a plurality of gain minimum at the same certain frequencies and a plurality of delay maximum at the same certain frequencies so that the decay rate is substantially identical at all frequencies.

3. A signal processing system comprising:

a first delay module for creating an output signal;

a first multiplier for scaling the output signal with a first gain;

a second multiplier for scaling the output signal, modified by the first gain, with a second gain; and a filter formed from the first delay module, the first multiplier, and the second multiplier for creating a comb filter amplitude and delay output response characterized by a plurality of peak delay maximum at certain frequencies and decreased gain minimum at the same certain frequencies.

4. The signal processing system of claim 3 in serial combination with an energy transmission network for processing a signal, the energy transmission network comprising:

a second delay module capable of creating a second output; and a third multiplier for scaling the second output by a third gain, where the second delay module and the third multiplier are operatively coupled to form a third output signal.

5. The processing system of claim 4 wherein a portion of the second output signal is processed and filtered.

6. A plurality of the processing systems of claim 5 coupled in parallel with a source signal.

7. A plurality of the processing systems of claim 5 coupled in series with a source signal.

8. The processing system of claim 4 in combination with one or more filters with frequency responses having one of increased and decreased gain at certain frequencies.

9. The processing system of claim 4 wherein a first filter is coupled in series with the second delay module and a second filter is combined with one of the first and second multipliers.

10. The processing system of claim 3 further comprising:
a second delay module, in series with the first delay module, for delaying the signal by a first delay value;
the first multiplier configured in parallel with the first delay module in a feedback circuit path; and
the second multiplier configured in parallel with the second delay module in a feedforward circuit path.

11. A method for processing a signal comprising:
(A) providing a notchpass filter comprising:
a first delay module for delaying the signal by a first delay value
a first multiplier for scaling the signal according to a first gain;
a second multiplier for scaling the signal according to a second gain;
the first delay module and first and second multipliers operatively coupled to form a signal processing circuit path; and
(B) supplying signals to first module, and first and second multipliers to process the signal so that the notchpass filter has a comb filter amplitude and delay output response characterized by a plurality of peak delay maximum at certain frequencies and decreased gain minimum at the same certain frequencies.

12. The method of claim 11 further comprising:
(C) combining the notchpass filter with an energy transmitting network comprising:
a second module for delaying the signal by a second delay value; and
a third multiplier for scaling the signal according to a third gain; and
the second delay module and third multipliers operatively coupled to form a signal processing circuit path that both delays and scales the signal; and
(D) supplying signals to second module and third multiplier to process the signal so that the combined notchpass filter and energy transmitting network have a comb filter amplitude and delay output response characterized by a plurality of peak delay maximum at the certain frequencies and decreased gain minimum at the same certain frequencies.

13. An apparatus for processing a signal comprising:
a notchpass filter comprising:
first delay module for delaying the signal by a first delay value;
first multiplier for scaling the signal according to a first gain;
second multiplier for scaling the signal according to a second gain; and
the first delay module and first and second multipliers operatively coupled to form a signal processing circuit path; and
logic configured for supplying signals to first module, and first and second multipliers to process the signal so that the notchpass filter has a comb filter amplitude and delay output response characterized by a plurality of peak delay maximum at certain frequencies and decreased gain minimum at the same certain frequencies.

14. The apparatus of claim 13 further comprising:
logic configured for combining the notchpass filter with an energy transmitting network comprising:
a second module for delaying the signal by a second delay value; and
a third multiplier for scaling the signal according to a third gain; and
the second delay module and third multipliers operatively coupled to form a signal processing circuit path that both delays and scales the signal; and
logic configured for supplying signals to second module and third multiplier to process the signal so that the combined notchpass filter and energy transmitting network have a comb filter amplitude and delay output response characterized by a plurality of peak delay maximum at certain frequencies and decreased gain minimum at the same certain frequencies.

15. A computer program product for digitally filtering data representing an audio signal and generating data representing processed audio signal data, the computer program product comprising a computer readable medium having embodied therein computer readable program code comprising:
i) first delay program code for delaying the audio signal data by a first delay value;
ii) first multiplier program code for scaling the audio signal data according to a first gain coefficient;
iii) second multiplier program code for scaling the audio signal data according to a second gain coefficient;
the first delay program code, and first multiplier program code and second multiplier program code operatively coupled to form a first audio signal processing path, the computer program product for digitally filtering having a comb filter amplitude and delay output response characterized by a plurality of delay maximum and a plurality of gain minimum at identical frequencies.

16. The computer program product of claim 15 further comprising:
iv) second delay program code for delaying the audio signal data by a second delay value,
v) third multiplier program code for scaling the audio signal data according to a third gain coefficient,
the second delay program code and third multiplier program code operatively coupled to form a second audio signal processing path that both delays and scales the audio signal data.

17. A computer program product for digitally filtering data representing an audio signal and generating data representing processed audio signal data, the computer program product comprising a computer readable medium having embodied therein program code comprising:
i) first delay program code for delaying the audio signal data by a first delay value;
ii) first multiplier program code for scaling the audio signal data according to a first gain coefficient;
iii) second multiplier program code for scaling the audio signal data according to a second gain coefficient;
the first delay program code, and first multiplier program code and second multiplier program code operatively coupled to form a first audio signal processing path, the processed audio signal data having a comb filter amplitude and delay output response characterized by a plurality of delay maximum and a plurality of gain minimum at identical frequencies.

18. The computer program product of claim 17 further comprising:

iv) second delay program code for delaying the audio signal data by a second delay value, v) third multiplier program code for scaling the audio signal data according to a third gain coefficient, the second delay program code and third multiplier program code operatively coupled to form a second audio signal processing path that both delays and scales the audio signal data.

19. The computer program product of claim 17 further comprising:

program code for resupplying a portion of processed audio signal data to one of the first audio signal processing path and second audio signal processing paths.

* * * * *